United States Patent
Shimizu et al.

(10) Patent No.: US 8,819,903 B2
(45) Date of Patent: Sep. 2, 2014

(54) MANUFACTURING METHOD OF A PIEZOELECTRIC ELEMENT AND A LIQUID EJECTING HEAD

(75) Inventors: Toshihiro Shimizu, Fujimi-machi (JP); Jiro Kato, Suwa (JP); Eiju Hirai, Okaya (JP); Hiroshi Ito, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 627 days.

(21) Appl. No.: 13/197,464

(22) Filed: Aug. 3, 2011

(65) Prior Publication Data
US 2012/0030915 A1  Feb. 9, 2012

(30) Foreign Application Priority Data

Aug. 4, 2010 (JP) ................................. 2010-175478

(51) Int. Cl.
| H04R 17/00 | (2006.01) |
| H01L 41/29 | (2013.01) |
| B41J 2/16 | (2006.01) |
| H01L 41/314 | (2013.01) |
| B41J 2/14 | (2006.01) |

(52) U.S. Cl.
CPC ................. H01L 41/29 (2013.01); B41J 2/161 (2013.01); B41J 2/1628 (2013.01); B41J 2/1631 (2013.01); *B41J 2002/14491* (2013.01); H01L 41/314 (2013.01)
USPC ........ 29/25.35; 29/592.1; 29/890.1; 310/324; 310/328; 310/330; 310/331; 310/348; 216/62; 216/65; 216/66

(58) Field of Classification Search
CPC ......... H01L 41/09; H01L 41/18; H01L 41/22; H01L 41/25; H01L 41/27; H01L 41/29; H01L 41/35; B41J 2/045; B41J 2/55; B41J 2/1621; B41J 2/1623; B41J 2/1628; B41J 2/1629; B41J 2/1635; B41J 2/1643; B41J 2/1646; B41J 2/1607; B41J 2/1612; B41J 2/162; B41J 2/14277
USPC ......... 29/5.35, 592.1, 594, 602.1, 609, 609.1; 310/324, 328, 330, 331, 335, 348; 216/62, 65, 66

See application file for complete search history.

(56) References Cited

U.S. PATENT DOCUMENTS

| 8,262,203 | B2 * | 9/2012 | Hirai et al. | 347/71 |
| 8,360,558 | B2 * | 1/2013 | Hirai et al. | 347/70 |
| 8,459,783 | B2 * | 6/2013 | Hirai et al. | 347/71 |
| 8,506,057 | B2 * | 8/2013 | Hirai | 347/68 |
| 2009/0284568 | A1 * | 11/2009 | Yazaki | 347/68 |

FOREIGN PATENT DOCUMENTS

JP  2005-088441  4/2005

\* cited by examiner

*Primary Examiner* — Paul D Kim
(74) *Attorney, Agent, or Firm* — Workman Nydegger

(57) ABSTRACT

A manufacturing method of a piezoelectric element includes: forming a first conductive layer upon a substrate; forming a piezoelectric layer upon the first conductive layer; forming a second conductive layer upon the piezoelectric layer; forming a third conductive layer upon the second conductive layer; forming a first portion, a second portion, and an opening portion provided between the first portion and the second portion by patterning the third conductive layer; forming a resist layer that covers the opening portion and covers the edges of the first portion and the second portion that face the opening portion side; and forming a first conductive portion and a second conductive portion configured from the first portion and the second portion, and forming a third conductive portion configured from the second conductive layer, by dry-etching the second conductive layer using the first portion, the second portion, and the resist layer as a mask.

8 Claims, 6 Drawing Sheets

MANUFACTURING METHOD OF A PIEZOELECTRIC ELEMENT AND A LIQUID EJECTING HEAD

This application claims a priority to Japanese Patent Application No. 2010-175478 filed on Aug. 4, 2010 which is hereby expressly incorporated by reference herein in its entirety.

BACKGROUND

1. Technical Field

The present invention relates to a manufacturing method of a piezoelectric element and a liquid ejecting head.

2. Related Art

A liquid ejecting head including piezoelectric elements is known as, for example, a liquid ejecting apparatus such as an ink jet printer that ejects a liquid such as ink. Such liquid ejecting heads are capable of changing the pressure within a pressure chamber formed below a piezoelectric element by causing the piezoelectric element to displace using a driving signal or the like, which makes it possible to eject a liquid such as ink, which has been supplied to the pressure chamber, through a nozzle hole.

Some such liquid ejecting heads are structured so that a piezoelectric layer is covered by an upper electrode, in order to protect the piezoelectric layer of the piezoelectric element, which is susceptible to external factors such as humidity and so on (see JP-A-2005-88441). Such a piezoelectric element includes an active region in which the piezoelectric layer is sandwiched between a lower electrode and the upper electrode, and the active region typically has a shape that extends in a specific direction when viewed from above. In this type of piezoelectric element, there are cases where there is too much displacement in the piezoelectric element at the ends of the active region in the lengthwise direction. As a result, there is the possibility that cracks will appear in the piezoelectric layer of the piezoelectric element, which leads to a drop in the reliability of the piezoelectric element.

Accordingly, what is needed is a piezoelectric element manufacturing method with which, a highly-reliable piezoelectric element capable of suppressing the occurrence of cracks can be manufactured with precision and ease.

SUMMARY

It is an advantage of some aspects of the invention to provide a manufacturing method of a piezoelectric element and a liquid ejecting head with which a highly-reliable piezoelectric element can be manufactured with precision and ease.

A manufacturing method of a piezoelectric element according to a first aspect of the invention includes:

forming a first conductive layer upon a substrate;

forming a piezoelectric layer upon the substrate and the first conductive layer;

forming a contact hole through piezoelectric layer on the first conductive layer;

forming a second conductive layer upon the piezoelectric layer and a first wiring layer in the contact hole;

forming a third conductive layer upon the second conductive layer and a second wiring layer which is connected to the first wiring layer and led out of the contact hole;

forming a first portion which is located at one end in the longitudinal direction of the second conductive layer, a second portion which is located at the other end in the longitudinal direction of the second conductive layer, and an opening portion provided between the first portion and the second portion by patterning the third conductive layer;

forming a resist layer that covers the opening portion and covers the edges of the first portion and the second portion that face the opening portion side; and forming a first conductive portion and a second conductive portion configured from the first portion and the second portion, and a third conductive portion configured from the second conductive layer, by dry-etching the second conductive layer using the first portion, the second portion, and the resist layer as a mask. In the invention, the term "upon" is taken to mean, for example, forming a specific item (called "A" hereinafter) upon another specific item (called "B" hereinafter). In a case such as that referred to by this example, in the invention, the term "upon" is used both in cases where B is formed directly upon A and in cases where B is formed upon A with another item therebetween. Likewise, the term "below" is used both in cases where B is formed directly below A and in cases where B is formed below A with another item therebetween.

According to this aspect of the invention, the first and second conductive portions and the third conductive portion are formed through dry etching using the first portion, the second portion, and the resist layer as a mask, and thus the first and second conductive portions can be disposed with precision at the end portions of the third conductive portion. Accordingly, in the manufacturing process, it is unnecessary to take into consideration alignment error in the dispositions of the first and second conductive portions relative to the end portions of the third conductive portion, which makes it possible to manufacture a highly-reliable piezoelectric element with precision and with ease.

In a piezoelectric element manufacturing method according to another aspect of the invention, it is preferable that the material of the second conductive layer be different from the material of the third conductive layer.

In a piezoelectric element manufacturing method according to another aspect of the invention, it is preferable that the material of the second conductive layer include iridium, and the material of the third conductive layer include gold and a nickel-chromium alloy.

In a piezoelectric element manufacturing method according to another aspect of the invention, it is preferable that The manufacturing method of the piezoelectric element according to claim 1, wherein the forming a first conductive portion, a second conductive portion, and a third conductive portion configured from the second conductive layer includes forming a concavity in an exposed portion of the piezoelectric layer that is between the second conductive layer and the second wiring layer, the second conductive layer and the second wiring layer being distanced from each other. A liquid ejecting head manufacturing method according to another aspect of the invention includes one of the piezoelectric element manufacturing methods described above.

BRIEF DESCRIPTION OF THE DRAWINGS

The invention will be described with reference to the accompanying drawings, wherein like numbers reference like elements.

FIG. 1A is a plan view schematically illustrating a piezoelectric element manufactured using a piezoelectric element manufacturing method according to an embodiment of the invention, whereas

DESCRIPTION OF EXEMPLARY EMBODIMENTS

Hereinafter, a preferred embodiment of the invention will be described in detail with reference to the drawings. First, a piezoelectric element 100 manufactured using a piezoelectric element manufacturing method according to this embodiment will be described, and after an example of a liquid ejecting head 600 that includes the piezoelectric element 100 is described, the piezoelectric element manufacturing method according to this embodiment will be described. Note that the embodiment described hereinafter is not intended to limit the invention as described in the aspects of the invention in any way. Furthermore, it is not necessarily the case that all of the elements described hereinafter are requisite elements of the invention.

1. Piezoelectric Element

Figure 1A:
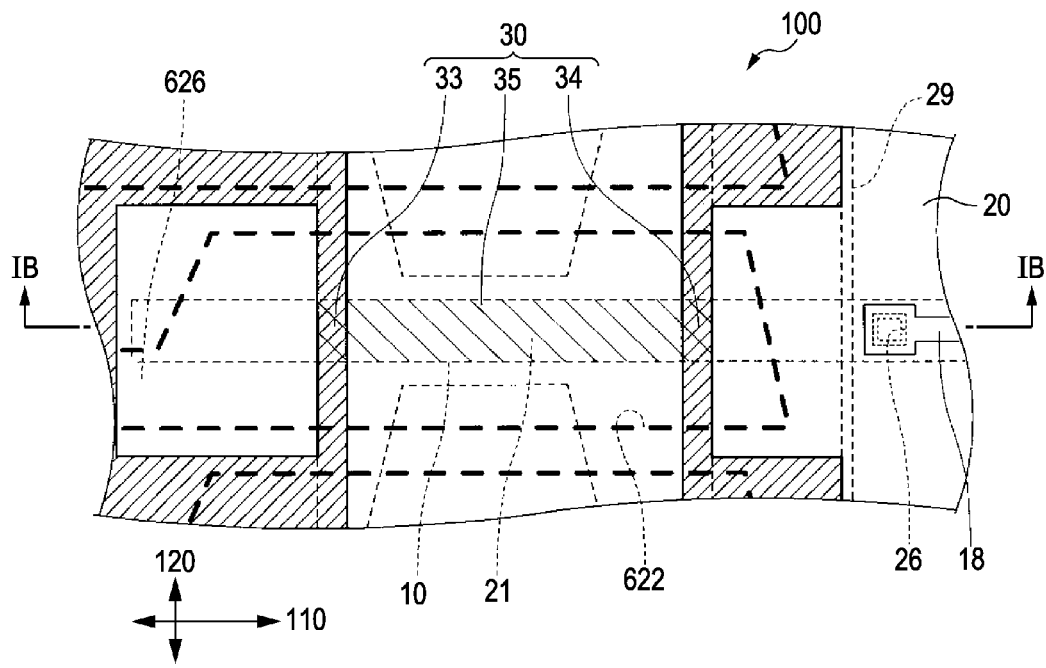
Figure 1B:
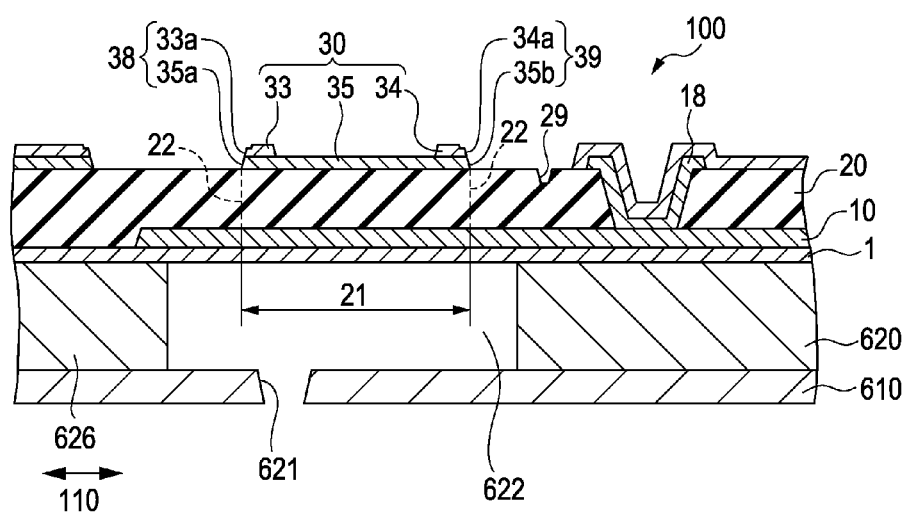
FIG. 1B is a cross-sectional view of the piezoelectric element taken along the IB-IB line shown in FIG. 1A.

FIG. 1A is a plan view schematically illustrating the piezoelectric element 100 manufactured using the piezoelectric element manufacturing method according to this embodiment and the primary elements of the liquid ejecting head 600 (see FIG. 2) that includes that piezoelectric element 100, whereas FIG. 1B is a cross-sectional view taken along the IB-IB line shown in FIG. 1A.

A substrate 1 can be realized as a flat plate formed of, for example, a conductor, a semiconductor, or an insulator. The substrate 1 may have a single-layer structure or a multi-layer structure. However, as long as the substrate 1 has a flat upper surface, the internal structure thereof is not limited, and the structure may be such that a space or the like is formed inside.

In the case where the piezoelectric element 100 is included in the liquid ejecting head 600, the substrate 1 is a vibrating plate, and is a member that exhibits a mechanical output when the piezoelectric element 100 operates. The substrate 1 can be employed as a mobile part of a piezoelectric actuator that includes the piezoelectric element 100, and may configure part of the wall of a pressure chamber or the like. An optimal thickness is selected for the substrate 1 based on the dimensions of the pressure chamber, the driving frequency, the elasticity of the material used, and so on (which will be mentioned later). The substrate 1 may be, for example, no less than 200 nm and no more than 2000 nm thick. If the substrate 1 is thinner than 200 nm, it is difficult to obtain a mechanical output such as vibration, whereas if the substrate 1 is thicker than 2000 nm, there are cases where it is difficult for the substrate 1 to vibrate. The substrate 1 can bend, vibrate, and so on as a result of operations of a piezoelectric layer 20.

In the case where the substrate 1 is a vibrating plate, it is desirable to include a material that is highly-resilient and has a high mechanical strength in the materials of the substrate 1. An inorganic oxide such as zirconium oxide, silicon nitride, or silicon oxide, an alloy such as stainless steel, or the like can be used as the material for the substrate 1. Of these, silicon oxide and zirconium oxide are favorable as the material for the substrate 1, in terms of their chemical stability and resilience. The substrate 1 may have a structure in which two or more of the materials listed as examples above are layered.

As shown in FIG. 1A and FIG. 1B, the piezoelectric element 100 is provided above the substrate 1. As shown in FIG. 1A and FIG. 1B, the piezoelectric element 100 includes a first electrode 10 provided on the substrate 1, the piezoelectric layer 20 that is formed so as to cover the first electrode 10, and a second electrode 30 that is formed so as to cover at least part of the piezoelectric layer 20.

As shown in FIG. 1B, the piezoelectric layer 20 includes an active region 21 that is sandwiched between the first electrode 10 and the second electrode 30, in a location that is above a pressure chamber 622. Here, the "active region 21" refers to a region of the piezoelectric layer 20 that substantially carries out driving when a voltage is applied thereto by the first and second electrodes 10 and 30, and is a region that is sandwiched between the first and second electrodes 10 and 30 after manufacturing or is defined when the piezoelectric layer 20 is formed during the manufacturing process based on the designing. Note that in FIG. 1A, the active region 21 is the region indicated by the diagonal hatching that is slanted to the left.

The first electrode 10 (note that this is called a "first conductive layer 10" in the descriptions of the piezoelectric element manufacturing method described later in this embodiment) is, as shown in FIG. 1A, formed so as to extend in a specific direction upon the substrate 1 (the vibrating plate). Here, the direction in which the first electrode 10 extends (that is, the lengthwise direction when viewing the first electrode 10 from above) is taken as a first direction 110. Accordingly, the direction that is orthogonal to the first direction 110 is taken as a second direction 120. The second direction 120 may be, for example, the widthwise direction when the first electrode 10 is viewed from above, or, in the case where multiple piezoelectric elements 100 are formed, may be the direction in which the piezoelectric elements 100 are arranged in parallel.

In the invention, references to "viewing from above" refer to a view from above in the normal direction to the surface of the substrate 1 on which the piezoelectric element 100 is formed.

The shape of the first electrode 10 is not particularly limited as long as the first electrode 10 overlaps with the second electrode 30 (described later) and the active region 21 can be formed above the pressure chamber 622. For example, as shown in FIG. 1A and FIG. 1B, the first electrode 10 may have end portions that extend beyond the second electrode 30 (described later) in the first direction 110, when viewed from above.

The structure and material of the first electrode 10 are not particularly limited as long as the first electrode 10 is conductive. For example, various types of metals such as Ni, Ir, Au, Pt, W, Ti, Pd, Ag, Ta, Mo, and Cr, alloys of those metals, conductive oxides thereof (for example, indium oxide), complex oxides of Sr and Ru, complex oxides of La and Ni, and so on can be used as the material for the first electrode 10. Meanwhile, the first electrode 10 may have a single layer of one of the materials described above, or may have a structure in which multiple materials are layered upon each other.

Although not particularly limited, the first electrode 10 can be set so as to have a thickness of, for example, no less than 20 nm and no more than 400 nm.

Furthermore, although not shown here, the first electrode 10 may include a barrier layer containing Ti, a Ti—W alloy, or the like. The barrier layer may be provided at the border between the first electrode 10 and the substrate 1 (vibrating plate), or may be provided at the border between the first electrode 10 and the piezoelectric layer 20.

Furthermore, although not shown here, the first electrode 10 may include an adhesive layer for increasing the adhesive strength between the first electrode 10 and the substrate 1 (vibrating plate). The adhesive layer can be formed of titanium, titania ($TiO_2$), zirconia, zirconium, or the like.

As shown in FIG. 1A and FIG. 1B, the piezoelectric layer 20 is provided above the substrate 1 (vibrating plate) and the first electrode 10. The shape of the piezoelectric layer 20 is not particularly limited as long as the piezoelectric layer 20 covers the first electrode 10 at least above the pressure chamber 622. For example, in the case where multiple piezoelectric elements 100 are formed along the second direction 120, openings may be formed in the piezoelectric layer 20 between adjacent active regions 21.

The piezoelectric layer 20 is configured of a polycrystal having piezoelectric properties, and can vibrate as a result of a voltage being applied to the piezoelectric element 100. The structure of the piezoelectric layer 20 is not particularly limited as long as the piezoelectric layer 20 has piezoelectric properties. It is favorable to use a perovskite oxide, indicated by the general formula $ABO_3$, as the material of the piezoelectric layer 20. Lead zirconate titanate ($Pb(Zr,Ti)O_3$), lead zirconate titanate niobate ($Pb(Zr,Ti,Nb)O_3$), barium titanate ($BaTiO_3$), potassium sodium niobate (($K,Na)NbO_3$), and so on can be given as specific examples of such a material. Although not particularly limited, the piezoelectric layer 20 can be set so as to have a thickness of, for example, no less than 300 nm and no more than 5000 nm.

Meanwhile, as shown in FIG. 1A and FIG. 1B, a contact hole 26 that exposes part of the first electrode 10 is formed in the piezoelectric layer 20. The position of the contact hole 26 is not particularly limited as long as that position is both above an area of the first electrode 10 under which the pressure chamber 622 is not located and is distanced from the region in which the second electrode (described later) is provided. For example, as shown in FIG. 1B, the contact hole 26 is disposed so as to be adjacent to the active region 21 in the first direction 110. The shape of the contact hole 26 is not particularly limited as long as the contact hole 26 can expose the first electrode 10.

As shown in FIG. 1A and FIG. 1B, a lead wiring layer 18 is formed within the contact hole 26. The lead wiring layer 18 is a lead wire for the first electrode 10, and is connected to a driving circuit (not shown). Accordingly, the lead wiring layer 18 is electrically insulated from the second electrode 30 (described later). Various types of metals such as Ni, Ir, Au, Pt, W, Ti, Ta, Mo, and Cr, alloys of those metals, conductive oxides thereof (for example, iridium oxide), complex oxides of Sr and Ru, complex oxides of La and Ni, and so on can be used for the lead wiring layer 18. Furthermore, the lead wiring layer 18 may be configured so as to have multiple conductive layers layered upon each other, as shown in FIG. 1B, or may be configured of a single layer.

In addition, a concavity 29 may be formed in the piezoelectric layer 20 between the lead wiring layer 18 and the second electrode 30 (described later), as shown in FIG. 1B. The shape of the concavity 29 is not particularly limited as long as it is a shape that is recessed further inward than the surface of the piezoelectric layer 20 on which the second electrode 30 is formed, and although not shown, the concavity 29 may extend in the second direction 120. The concavity 29 may be a concavity that is formed when the piezoelectric layer 20 is over-etched during an etching process carried out in the piezoelectric element manufacturing method according to this embodiment. Alternatively, the concavity 29 may be a rough surface (that is, a surface processed so as to be rough) in which multiple concavities and protrusions are formed so as to be adjacent to each other (this is not shown). Through this, the surface distance created by the piezoelectric layer 20 between the second electrode 30 and the lead wiring layer 18 that are electrically insulated from each other can be increased, which makes it possible to improve the insulation between the second electrode 30 and the lead wiring layer 18; this in turn makes it possible to avoid short-circuits between the second electrode 30 and the lead wiring layer 18.

As shown in FIG. 1A and FIG. 1B, the second electrode 30 is provided upon the piezoelectric layer 20, and overlaps with the first electrode 10 in the area above the pressure chamber 622, thus forming the active region 21 in the piezoelectric layer 20. The shape of the second electrode 30 is not particularly limited as long as the active region 21 can be formed in the piezoelectric layer 20 above the pressure chamber 622. For example, as shown in FIG. 1A and FIG. 1B, the second electrode 30 includes two end portions 38 and 39 that extend in the first direction 110 in an area above the pressure chamber 622, which is part of a flow channel formation plate 620. Note that as shown in FIG. 1A and FIG. 1B, the end portion of the second electrode 30 that is located on the side of the first direction 110 in which the lead wiring layer 18 is formed may be the end portion 39, whereas the end portion on the side opposite thereto may be the end portion 38. In the case where multiple piezoelectric elements 100 are formed in the second direction 120, the second electrode 30 functions as a common electrode in which multiple second electrodes 30 are connected to each other. Meanwhile, although not shown, the second electrode 30 may be electrically connected to the driving circuit (not shown).

As shown in FIG. 1A and FIG. 1B, the second electrode 30 includes a first conductive portion 33, a second conductive portion 34, and a third conductive portion 35. As shown in FIG. 1B, the first conductive portion 33 and the second conductive portion 34 are disposed above the end portions 38 and 39, respectively, of the third conductive portion 35.

The third conductive portion 35 is, as shown in FIG. 1A and FIG. 1B, a conductive portion that is provided upon the piezoelectric layer 20 in the area above the active region 21. End portions 35a and 35b of the third conductive portion 35 in the first direction 110 are configured as parts of the end portions 38 and 39, respectively, of the second electrode 30, as shown in FIG. 1A and FIG. 1B. The material of the third conductive portion 35 is not particularly limited as long as the material is a conductive material. Various types of metals such as Ir, Ni, Au, Pt, W, Ti, Ta, Mo, Cr, Pd, and Ag, alloys of those metals, conductive oxides thereof (for example, iridium oxide), complex oxides of Sr and Ru, complex oxides of La and Ni, and so on can be used as the material of the third conductive portion 35. Meanwhile, the third conductive portion 35 may have a single layer of one of the materials described above, or may have a structure in which multiple materials are layered upon each other. Although not particularly limited, the third conductive portion 35 can be set so as to have a thickness of, for example, no less than 10 nm and no more than 200 nm.

In FIG. 1A, the first conductive portion 33 corresponds to the area indicated by the diagonal hatching that slants to the right. The first conductive portion 33 is, as shown in FIG. 1A and FIG. 1B, disposed above the end portion 35a on one side of the third conductive portion 35 in the first direction 110. As shown in FIG. 1B, an end portion 33a of the first conductive portion 33 configures part of the end portion 38 of the second electrode 30. Here, the end portion 33a is disposed as close to the side surface of the end portion 35a in the third conductive portion 35 as possible without covering the side surface of the end portion 35a. The surface shape of the end portion 33a in the first direction 110 may be a surface in which multiple steps are formed so that the thickness of the end portion 33a decreases in stages. Alternatively, the shape of the end portion 33a in the first direction 110 may be a tapered shape. The angle of the taper between the tapered surface of the end portion 33a and the surface of the first conductive portion 33 that makes contact with the third conductive portion 35 may be less than the angle of the taper between the tapered surface of the end portion 35a and the surface of the third conductive portion 35 that makes contact with the piezoelectric layer 20.

Assuming that the length of the active region 21 in the first direction 110 when viewed from above is L, the width of the first conductive portion 33 in the first direction 110 can be designed as appropriate, as long as that width is less than L/2, which is half of the length L. The first conductive portion 33 may be thicker than the third conductive portion 35. Although not particularly limited, the first conductive portion 33 can be set so as to have a thickness of, for example, no less than 50 nm and no more than 5000 nm. Accordingly, the third conductive portion 35 that covers a large part of the upper area of the active region 21 is thinner than the first conductive portion 33 that is provided only above the end portions of the active region 21 in the first direction 110, and therefore it is possible to reduce the amount by which the piezoelectric element displaces as being suppressed by the second electrode 30. Furthermore, the first conductive portion 33 that is provided only above the end portions of the active region 21 in the first direction 110 is relatively thicker than the third conductive portion 35, and it is therefore possible to effectively suppress the piezoelectric element from displacing too much at the end portions of the active region 21 in the first direction 110. In addition, the first conductive portion 33 and the second conductive portion 34 (described later) can function as lead wires. Accordingly, by forming the first conductive portion 33 and the second conductive portion 34 to be thicker than the third conductive portion 35, it is possible to reduce the electrical resistance value of the lead wires.

As shown in FIG. 1A, it is preferable for the first conductive portion 33 to be disposed so as not to overlap with the first electrode 10 in the regions outside of the active region 21 when viewed from above. In addition, in the case where multiple piezoelectric elements 100 are formed, the first conductive portion 33 may serve as a common conductive portion across the second direction 120. Although the material of the first conductive portion 33 is not particularly limited as long as that material is a conductive material, it is preferable to use a material that has a higher conductivity than the third conductive portion 35. For example, the first conductive portion 33 contains Au. The first conductive portion 33 may further contain Cu, Pd, Ni, a Ni—Cr alloy, or the like.

In FIG. 1A, the second conductive portion 34 corresponds to the area indicated by the diagonal hatching that slants to the right, like the first conductive portion 33. The second conductive portion 34 is, as shown in FIG. 1A and FIG. 1B, disposed above the end portion 35b on one side of the third conductive portion 35 in the first direction 110. As shown in FIG. 1B, an end portion 34a of the second conductive portion 34 configures part of the end portion 39 of the second electrode 30. Here, the end portion 34a is disposed as close to the side surface of the end portion 35b in the third conductive portion 35 as possible without covering the side surface of the end portion 35b. Note that the configuration of the second conductive portion 34 (that is, the surface, the length, and the thickness) and the material thereof may be the same as those of the first conductive portion 33.

As shown in FIG. 1A, it is preferable for the second conductive portion 34 to be disposed so as to be sufficiently distanced from and insulated from the lead wiring layer 18 of the first electrode 10, in the regions outside of the active region 21 when viewed from above. In addition, in the case where multiple piezoelectric elements 100 are formed, the second conductive portion 34 may serve as a common conductive portion across the second direction 120.

Any of the configurations described thus far can be employed as the configuration of the piezoelectric element 100. As described above, in such a piezoelectric element 100, the first conductive portion 33 and the second conductive portion 34 are disposed at the end portions 38 and 39 in the first direction 110, which is the lengthwise direction of the piezoelectric element 100. Through this, the first conductive portion 33 and the second conductive portion 34 are capable of suppressing excessive displacement/vibration which generally occurs at the end portions of the active region 21 in the lengthwise direction. Accordingly, it is possible to suppress the occurrence of cracks at the end portions of the active region 21 in the lengthwise direction, which in turn makes it possible to improve the reliability of the piezoelectric element 100.

Here, disposing the first and second conductive portions 33 and 34 so as to be closer to the end portions 35a and 35b of the third conductive portion 35 in a precise manner makes it possible to increase an effect in which the excessive displacement/vibration at the end portions of the active region 21 in the lengthwise direction is suppressed. In other words, as shown in FIG. 1B, disposing the end portions 33a and 34a so as to be as close as possible to the side surfaces of the end portions 35a and 35b of the third conductive portion 35 when viewed from above makes it possible to improve the reliability of the piezoelectric element 100.

2. Liquid Ejecting Head

Figure 2:
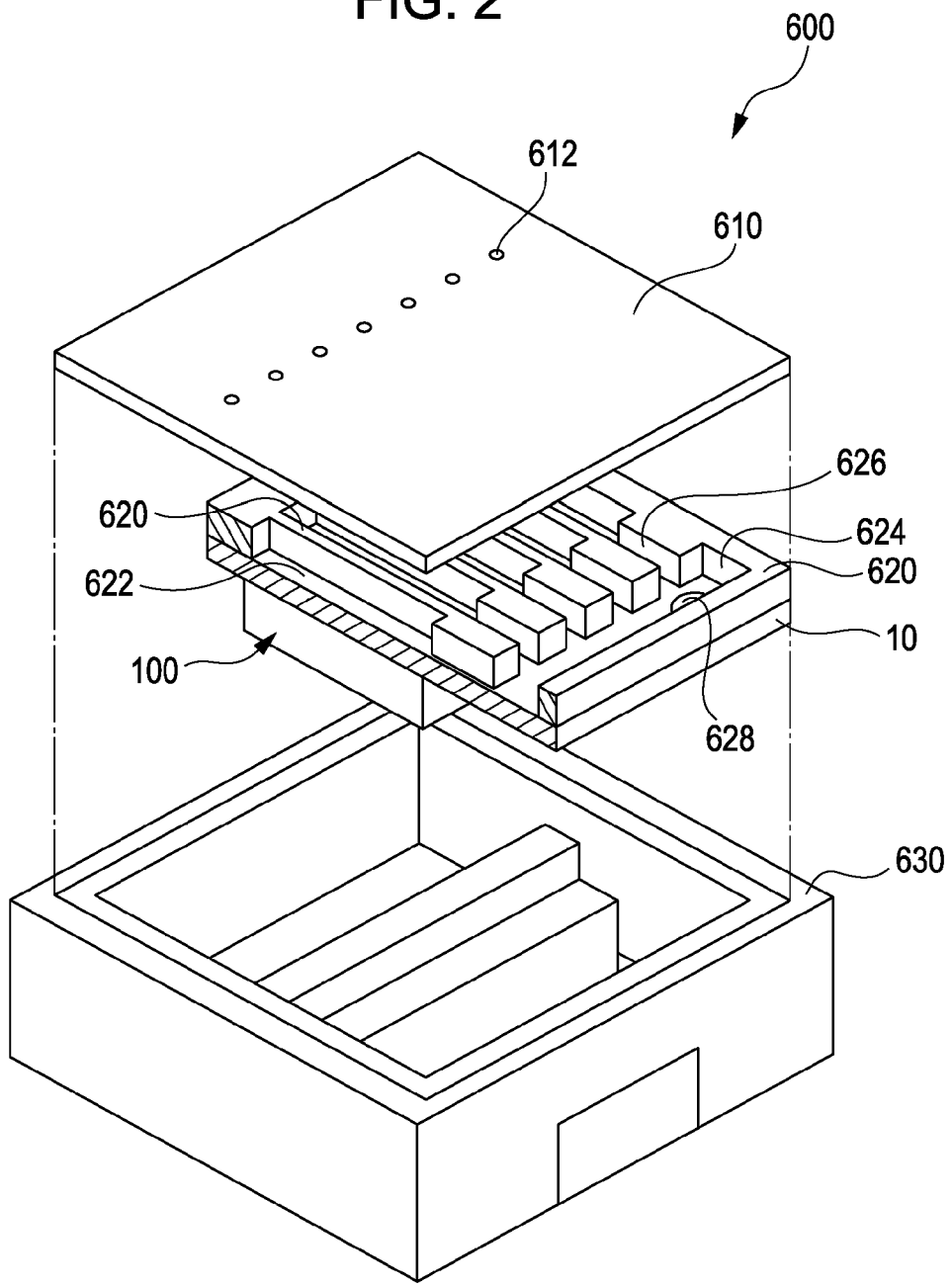
FIG. 2 is an exploded perspective view schematically illustrating a liquid ejecting head including the piezoelectric element manufactured using the piezoelectric element manufacturing method according to the embodiment of the invention.

Next, the liquid ejecting head 600, in which the piezoelectric element 100 according to this embodiment functions as a piezoelectric actuator, will be described with reference to the drawings. FIG. 1A and FIG. 1B are a plan view and a cross-sectional view, respectively, schematically illustrating the primary elements (that is, the piezoelectric element 100) of the liquid ejecting head 600 according to this embodiment. FIG. 2, meanwhile, is an exploded perspective view of the liquid ejecting head 600 according to this embodiment, and illustrates the liquid ejecting head 600 as being inverted vertically from the orientation in which the head is normally used.

The liquid ejecting head 600 includes the aforementioned piezoelectric element 100. The following example describes the liquid ejecting head 600 assuming that the substrate 1 is formed as a vibrating plate and the piezoelectric element 100 is configured as a piezoelectric actuator.

As shown in FIG. 1A, FIG. 1B, and FIG. 2, the liquid ejecting head 600 includes a nozzle plate 610 having nozzle holes 612, the flow channel formation plate 620 for forming the pressure chamber 622, and the piezoelectric element 100.

The number of piezoelectric elements 100 is not particularly limited, and multiple piezoelectric elements 100 may be formed. Note that in the case where multiple piezoelectric elements 100 are formed, the second electrode 30 functions as a common electrode. Furthermore, as shown in FIG. 2, the liquid ejecting head 600 can include a housing 630. Note that in FIG. 2, the piezoelectric element 100 is illustrated in a simplified manner.

As shown in FIG. 1A, FIG. 1B, and FIG. 2, the nozzle plate 610 includes the nozzle holes 612. A liquid such as ink can be ejected as droplets from the nozzle holes 612 (in addition to liquids, this also includes various types of functional materials whose viscosities have been adjusted to an appropriate level using a solvent, a dispersion medium, or the like, or that contain metal flakes or the like, hereinafter the same as above). The multiple nozzle holes 612 are provided in, for example, a single row in the nozzle plate 610. Silicon, stainless steel (SUS), and so on can be given as examples of materials that can be used for the nozzle plate 610.

The flow channel formation plate 620 is provided above the nozzle plate 610 (below, from the perspective in the example shown in FIG. 2). Silicon or the like can be given as an example of the material of which the flow channel formation plate 620 is formed. As shown in FIG. 2, a reservoir (liquid holding area) 624, a supply opening 626 that communicates with the reservoir 624, and the pressure chamber 622 that communicates with the supply opening 626, are provided by the flow channel formation plate 620 partitioning the space between the nozzle plate 610 and the vibrating plate 1. In this example, the reservoir 624, the supply opening 626, and the pressure chamber 622 are described as being partitioned from each other, but all of these elements are flow channels for a liquid or the like, and such flow channels may be designed in any manner. Furthermore, for example, the supply opening 626 is shaped as a narrowed path that configures part of the flow channel in the example shown in FIG. 2, but the supply opening 626 can be formed as desired according to the design, and the configuration described here is not absolutely necessary. The reservoir 624, the supply opening 626, and the pressure chamber 622 are partitioned by the nozzle plate 610, the flow channel formation plate 620, and the vibrating plate 1. The reservoir 624 is capable of temporarily holding ink supplied from the exterior (for example, an ink cartridge) through a passage hole 628 provided in the vibrating plate 1. The ink within the reservoir 624 can be supplied to the pressure chamber 622 via the supply opening 626. The volume of the pressure chamber 622 changes as a result of the deformation of the vibrating plate 1. The pressure chamber 622 communicates with the nozzle holes 612, and the liquid or the like is ejected through the nozzle holes 612 as a result of the change in the volume of the pressure chamber 622.

The piezoelectric element 100 is provided above the flow channel formation plate 620 (below, in the example shown in FIG. 2). The piezoelectric element 100 is electrically connected to a piezoelectric element driving circuit (not shown), and can operate (vibrate, deform) based on a signal from the piezoelectric element driving circuit. The vibrating plate (substrate 1) deforms as a result of the movements of the layered structure (the piezoelectric layer 20), and can therefore cause the pressure within the pressure chamber 622 to change as appropriate.

As shown in FIG. 2, the housing 630 is capable of housing the nozzle plate 610, the flow channel formation plate 620, and the piezoelectric element 100. A resin, a metal, or the like can be given as examples of the material used for the housing 630.

The liquid ejecting head 600 includes the aforementioned piezoelectric element 100. Accordingly, it is possible to realize a liquid ejecting head that has improved reliability.

The foregoing descriptions have illustrated a case in which the liquid ejecting head 600 is an ink jet recording head. However, the liquid ejecting head according to the invention can also be used as a coloring material ejecting head used in the manufacture of color filters for liquid-crystal displays and the like, an electrode material ejecting head used to form the electrodes of organic EL displays, FEDs (front emission displays), and so on, a bioorganic matter ejecting head used in the manufacture of biochips, and so on.

3. Piezoelectric Element and Liquid Ejecting Head Manufacturing Method

Next, a manufacturing method for the piezoelectric element 100 according to this embodiment will be described. FIG. 3A through FIG. 5C are cross-sectional views schematically illustrating a manufacturing process for the piezoelectric element 100 according to this embodiment and a manufacturing process for the liquid ejecting head according to this embodiment. Hereinafter, a case in which the piezoelectric element 100 included in the liquid ejecting head 600 is manufactured will be described as an example. Accordingly, the piezoelectric element manufacturing method according to this embodiment is not limited to the descriptions given hereinafter.

Figure 3A:
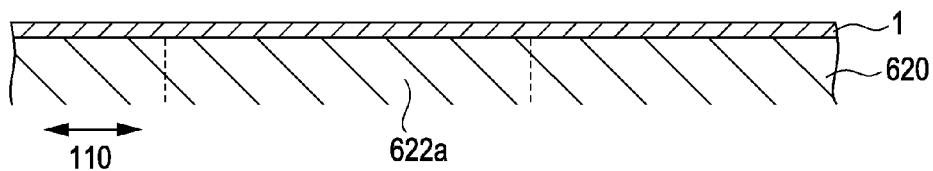
FIGS. 3A through 3D are cross-sectional views schematically illustrating a manufacturing process for the piezoelectric element and the liquid ejecting head according to the embodiment of the invention.

First, as shown in FIG. 3A, the substrate 1 is prepared. In the case where the liquid ejecting head 600 that includes the piezoelectric element 100 is manufactured, a vibrating plate formed upon the flow channel formation plate 620 is prepared as the substrate 1. The flow channel formation plate 620 prepared here may or may not already have the flow channels such as the pressure chamber 622 formed therein. In this embodiment, the flow channel formation plate 620 that is prepared does not have the flow channels such as the pressure chamber 622 formed therein, but does include a region 622a that will serve as the pressure chamber 622. Note that the details of the substrate 1 have been given above and will therefore be omitted here.

Figure 3B:
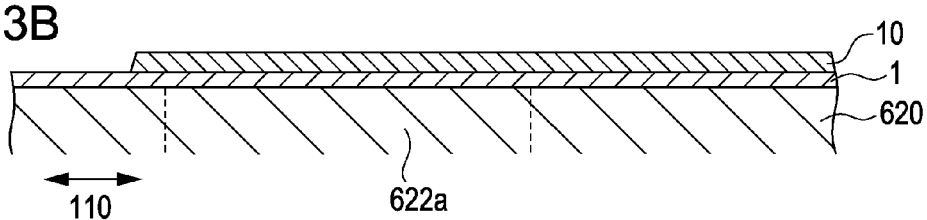

Next, as shown in FIG. 3B, the first conductive layer 10 (the first electrode 10) is formed upon the substrate 1 (vibrating plate). The method by which the first conductive layer 10 is formed is not particularly limited, and a known deposition method can be used. For example, the first conductive layer 10 can be formed with a desired shape by forming a conductive film through deposition such as CVD or PVD, plating, sputtering, MOD, spin coating, or the like, and then carrying out a known patterning process on the conductive film. Note that the details of the first conductive layer 10 (first electrode 10) have been given above and will therefore be omitted here.

The aforementioned known deposition method can also be applied in the known formation methods for the following conductive layers. Meanwhile, as the known patterning method used in the piezoelectric element manufacturing method according to this embodiment, a known photolithography technique and/or a known etching technique can be carried out after forming a suitable resist layer based on the desired shape. In the case where an etching technique is used, wet etching or dry etching can be used as appropriate.

Here, although not shown, an anti-oxidization film such as a titanium oxide film, an orientation control film that controls the orientation of the piezoelectric layer such as a titanium film, a lanthanum nickel oxide film, or the like can be formed upon the first conductive layer 10, upon the substrate 1 (vibrating plate), or the like. Furthermore, an adhesive layer such as titanium, chromium, or the like may be included between the first conductive layer 10 and the substrate 1 (vibrating plate).

Figure 3C:
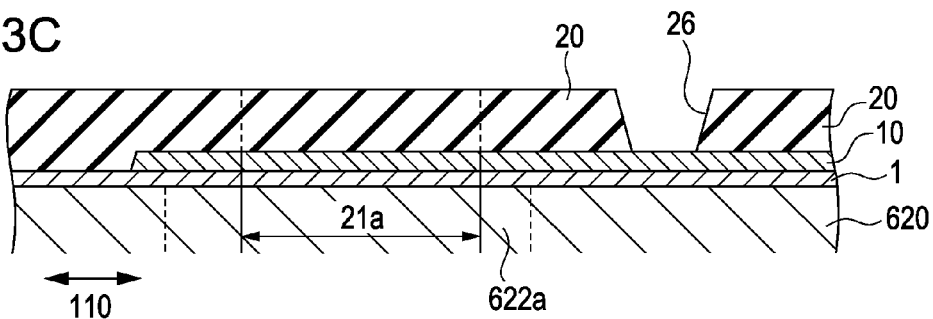

Next, as shown in FIG. 3C, the piezoelectric layer 20 is formed upon the first conductive layer 10 so as to include a region 21a that will serve as the active region 21. As shown in FIG. 3C, part of the piezoelectric layer 20 that is formed upon the first conductive layer 10 in an area above the region 622a in which the pressure chamber 622 is formed corresponds to the region 21*a* that will serve as the active region 21.

The method by which the piezoelectric layer 20 is formed is not particularly limited, and a known formation method can be used. First, for example, a piezoelectric material film is formed through the sol-gel method or the like. The piezoelectric material film may also be formed through spin coating, CVD, MOD, sputtering, laser abrasion, or the like. Next, the piezoelectric material film undergoes thermal processing in order to crystallize the piezoelectric material. Through this, a piezoelectric film configured from the crystallized piezoelectric material can be formed. The conditions of the thermal processing are not particularly limited as long as the temperature is such that the piezoelectric material that is used can be crystallized. The thermal processing may be carried out in, for example, an oxygen atmosphere, at a temperature that is no less than 500° C. and no more than 800° C. Note that the details of the piezoelectric layer 20 have been given above and will therefore be omitted here.

Next, the piezoelectric layer 20 can be formed by patterning the piezoelectric film into a desired shape. Here, as shown in FIG. 3C, the process in which the piezoelectric layer 20 is patterned may include a process for forming the contact hole 26 that exposes part of the first conductive layer 10. Here, the contact hole 26 is formed in a position that is distanced from the region in which a second conductive layer 30, mentioned later, is formed.

Figure 3D:
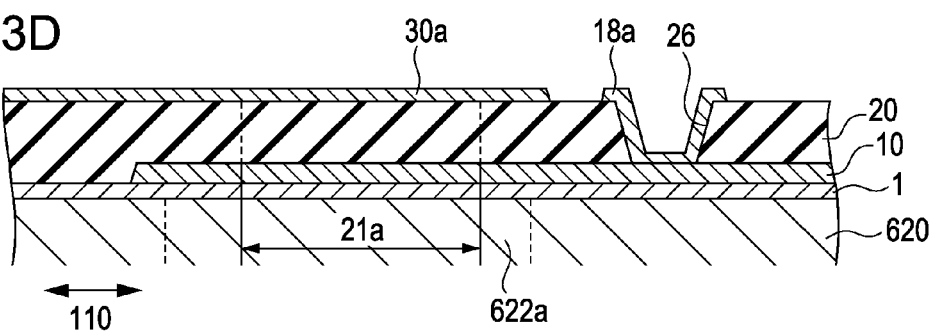

Next, as shown in FIG. 3D, a second conductive layer 30*a* that overlaps with the region 21*a* that is to serve as the active region 21 is formed upon the piezoelectric layer 20. Here, the second conductive layer 30*a* may contain iridium as its primary component. The second conductive layer 30*a* is a conductive layer that is patterned and serves as the aforementioned third conductive portion 35. Accordingly, as shown in FIG. 3D, the second conductive layer 30*a* is formed so as to overlap with at least the region 21*a*. Furthermore, the second conductive layer 30*a* is patterned so as to have an outside shape that is larger than the desired outside shape of the third conductive portion 35.

Here, as shown in FIG. 3D, the process for forming the second conductive layer 30*a* may include a process for forming a wiring layer 18*a* that is electrically connected to the first conductive layer 10 within the contact hole 26 and is distanced from the second conductive layer 30*a*. The wiring layer 18*a* is a wiring layer that serves as part of the lead wiring layer 18, and is provided so as to cover at least the first conductive layer 10 within the contact hole 26. Accordingly, the surface of the first conductive layer 10 that is exposed within the contact hole 26 can be protected from damage in the processes that follow thereafter, which makes it possible to improve the reliability of the electric connection between the first conductive layer 10 (the first electrode 10) and the lead wiring layer 18.

Figure 4A:
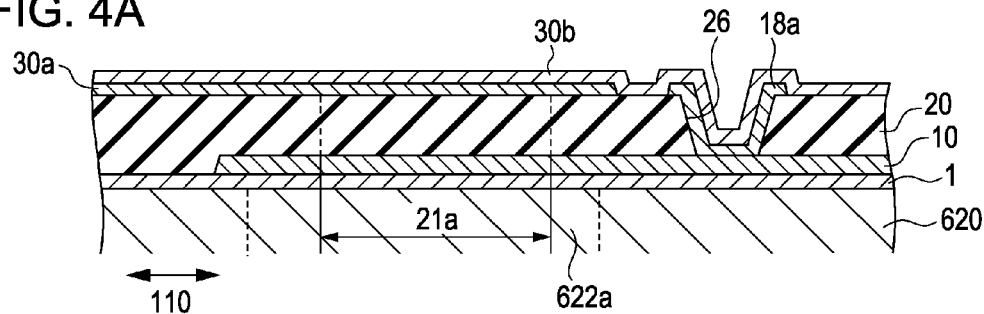
FIGS. 4A through 4D are cross-sectional views schematically illustrating a manufacturing process for the piezoelectric element and the liquid ejecting head according to the embodiment of the invention.

Next, as shown in FIG. 4A, a third conductive layer 30*b* is formed upon the second conductive layer 30*a* so as to overlap with the region 21*a*. The third conductive layer 30*b* may cover the second conductive layer 30*a* and the wiring layer 18*a* in a continuous manner. Here, the material of the third conductive layer 30*b* may be different from the material of the second conductive layer 30*a*. For example, the third conductive layer 30*b* may contain gold as its primary component, and may also contain a nickel-chromium alloy. Here, the third conductive layer 30*b* may be formed so as to be thicker than the second conductive layer 30*a*.

Figure 4B:
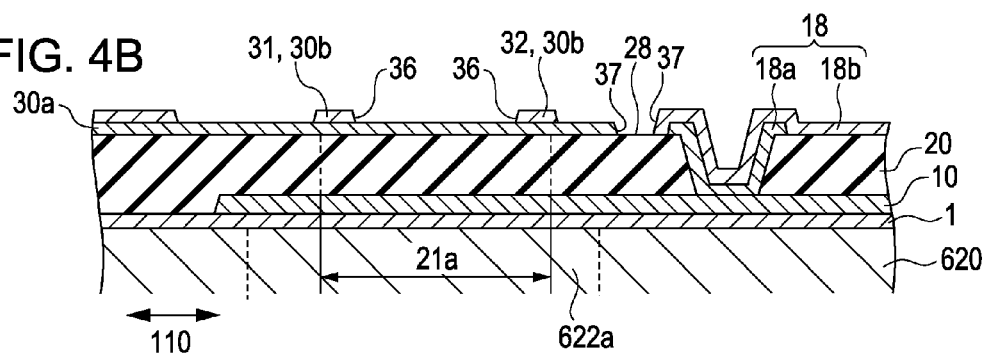

Next, as shown in FIG. 4B, a first portion, a second portion, and an opening portion provided between the first portion and the second portion are formed by patterning the third conductive layer 30*b*. Through this, as shown in FIG. 4B, a first portion 31 of the third conductive layer 30*b* is formed above one end surface 22 of the region 21*a* in the first direction 110, and a second portion 32 of the third conductive layer 30*b* is formed above the other end surface 22 in the first direction 110. As shown in FIG. 4B, an opening portion 36 is located further inside than the end surfaces 22 of the region 21*a* in the first direction 110, when viewed from above. The opening portion 36 should at least divide the third conductive layer 30*b* into the first portion 31 and the second portion 32 in the area above the region 21*a*; outside of the region in which the piezoelectric element 100 is formed, the first portion 31 and the second portion 32 may be continuous, or may be completely divided by the opening portion 36.

Furthermore, as shown in FIG. 4B, when patterning the third conductive layer 30*b* in order to form the opening portion 36, an opening portion 37 that divides the aforementioned third conductive layer 30*b* formed upon the wiring layer 18*a* from the aforementioned first and second portions 31 and 32 is formed. Through this, a wiring layer 18*b* is formed upon the wiring layer 18*a*, which makes it possible to form the lead wiring layer 18 (18*a* and 18*b*) that is electrically connected to the first conductive layer 10 within the contact hole 26 and is separated from the second conductive layer 30*a*. Furthermore, as shown in FIG. 4B, forming the opening portion 37 makes it possible to provide a portion 28 in which the piezoelectric layer 20 is exposed between the second conductive layer 30*a* and the lead wiring layer 18, which are distanced from each other.

Figure 4C:
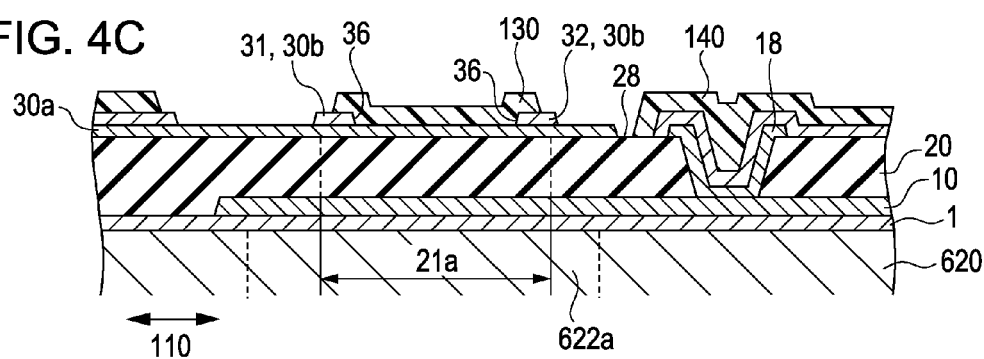

Next, as shown in FIG. 4C, a resist layer 130 is formed upon the third conductive layer 30*b* so as to cover the opening portion 36 and cover the edges of the first portion 31 and the second portion 32 that face the opening portion 36. Here, the "edges of the first portion 31 and the second portion 32" refers to the side surfaces of those portions that face toward the opening portion 36 and part of the upper surfaces of those portions that continue from the side surfaces. The resist layer 130 is provided so as to extend from above the edge of the first portion 31 to above the edge of the second portion 32, passing through the opening portion 36, in the first direction 110. Through this, the edges of the first portion 31 and the second portion 32 on the side opposite to the opening portion 36 can be exposed from the resist layer 130. Furthermore, as shown in FIG. 4C, the location in the first direction 110 in which the resist layer 130 is disposed can be determined as appropriate, taking into consideration the regression of the materials in the horizontal direction caused by the etching process (mentioned later) for the second conductive layer 30*a* and the third conductive layer 30*b* (31 and 32).

When forming the resist layer 130, as shown in FIG. 4C, a resist layer 140 is formed so as to cover the lead wiring layer 18. At this time, as shown in FIG. 4C, the resist layer 140 is provided so that the portion 28, in which the piezoelectric layer 20 is exposed, remains between the second conductive layer 30*a* and the lead wiring layer 18.

Figure 4D:
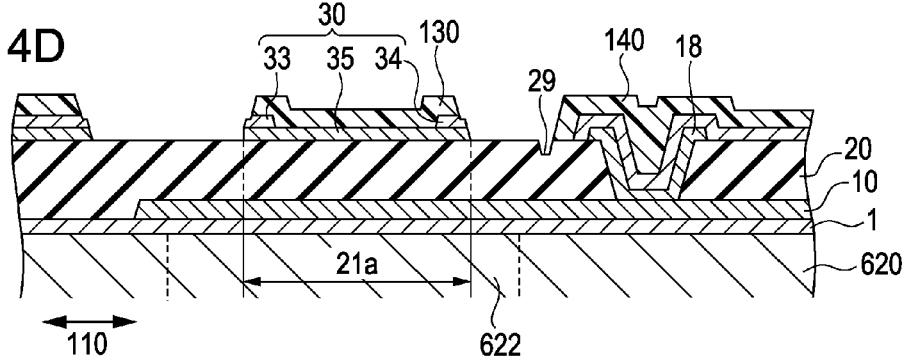

Next, as shown in FIG. 4D, the first portion 31, the second portion 32, and the resist layer 130 are masked and the second conductive layer 30*a* is dry-etched; as a result, the first conductive portion 33 and the second conductive portion 34 configured of the first portion 31 and the second portion 32, respectively, and the third conductive portion 35 configured of the second conductive layer 30*a*, are formed. As shown in FIG. 4C and FIG. 4D, the portions of the first portion 31 and the second portion 32 that are exposed from the resist layer 130 function as hard masks for the dry etching. Accordingly, the portions of the first portion 31 and the second portion 32 that are exposed from the resist layer 130 may be completely removed through the dry etching. Alternatively, some portions may be left after the dry etching and used as the first conductive portion 33 and the second conductive portion 34.

Here, the first conductive portion 33 and the second conductive portion 34 may be formed so that their thicknesses (the film thicknesses in the thickest areas) are greater than the thickness of the third conductive portion 35. Accordingly, the third conductive portion 35 that covers a large part of the upper area of the active region 21 is thinner than the first conductive portion 33 that is provided only above the end portions of the active region 21 in a first direction 110, and therefore it is possible to reduce occurrences of the amount by which the piezoelectric element displaces being suppressed by the second electrode 30. Furthermore, the first conductive portion 33 that is provided only above the end portions of the active region 21 in a first direction 110 is relatively thicker than the third conductive portion 35, and it is therefore possible to effectively suppress the piezoelectric element from displacing too much at the end portions of the active region 21 in the first direction 110. In addition, the first conductive portion 33 and the second conductive portion 34 (described later) can function as lead wires. Accordingly, by forming the first conductive portion 33 and the second conductive portion 34 to be thicker than the third conductive portion 35, it is possible to reduce the electrical resistance value of the lead wires.

In this etching process, a known dry etching technique may be employed. Through this, the etching can be carried out efficiently in the case where the second conductive layer 30a contains Ir. Dry etching that employs a high-density plasma device, such as ion milling, RIE (Reactive Ion Etching), or the like may be employed as the known dry etching technique. In the case where RIE is used, a chloride gas that contains $BCl_3$ or the like can be used as the etching gas used in the dry etching. In addition, the etching gas may include a fluoride gas containing $C_4F_8$, an argon gas, or the like in addition to the chloride gas.

Figure 5A:
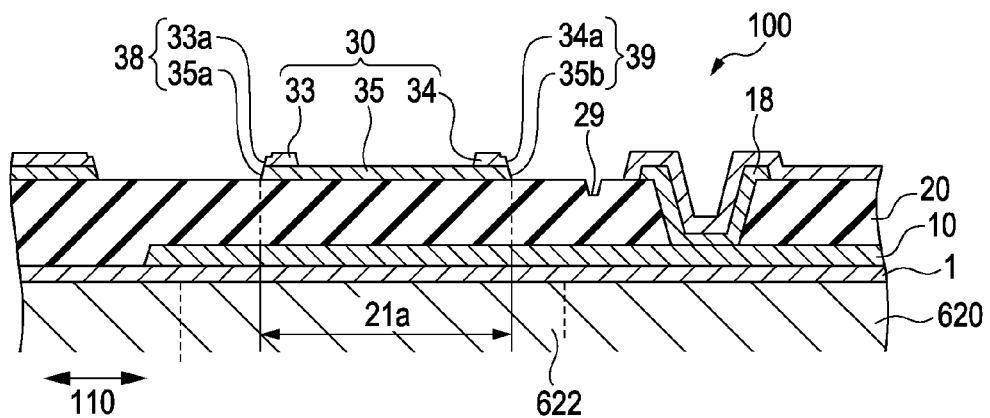
FIGS. 5A and 5B are cross-sectional views schematically illustrating a manufacturing process for the piezoelectric element and the liquid ejecting head according to the embodiment of the invention.

In addition, as shown in FIG. 5A, the portion 28 in which the piezoelectric layer 20 is exposed between the second conductive layer 30a and the lead wiring layer 18 is covered neither by the resist layer 130 nor the resist layer 140, and thus the piezoelectric layer 20 may be overetched during the dry etching, thus forming the concavity 29. In addition, although not shown, the concavity 29 may be processed through the dry etching so as to have a rough surface. As a result, the surface distance between the lead wiring layer 18 and the second electrode 30 (the third conductive portion 35) can be increased. Accordingly, the state of insulation between the lead wiring layer 18 and the second electrode 30 can be improved, which makes it possible to avoid short-circuits between the second electrode 30 and the lead wiring layer 18; this in turn makes it possible to increase the reliability of the piezoelectric element 100.

Figure 5B:
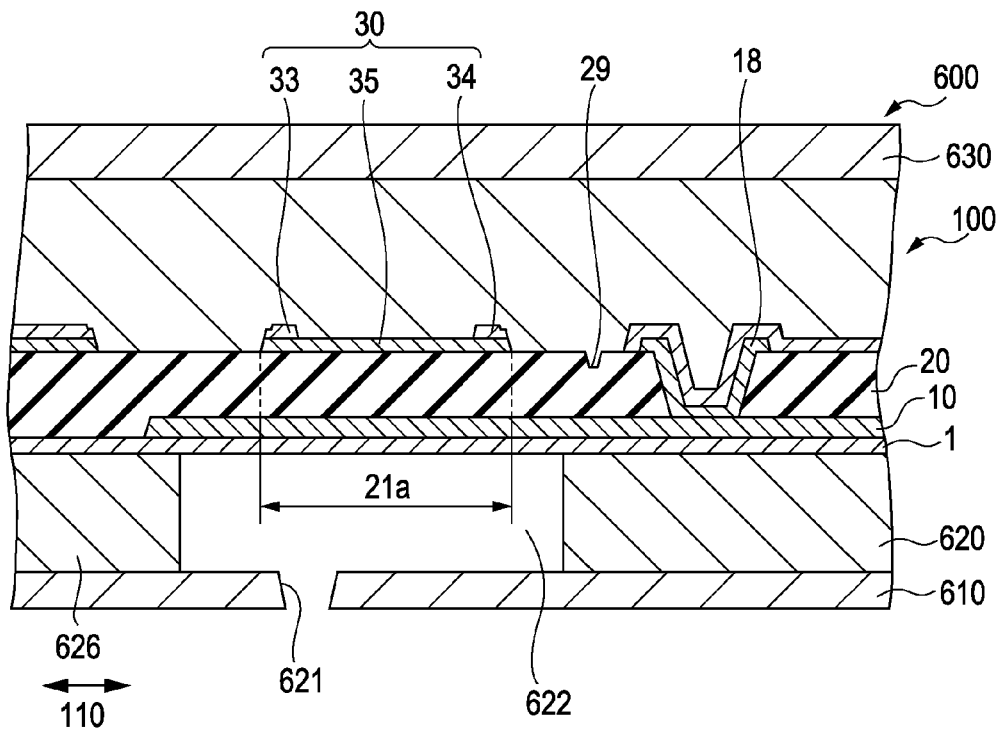

Next, as shown in FIG. 5B, the resist layers 130 and 140 are removed. This completes the manufacture of the piezoelectric element 100. However, although not shown here, the resist layers 130 and 140 may be only partially removed, using the remaining parts as a protective film.

Next, in the case where the liquid ejecting head 600 including the piezoelectric element 100 is to be manufactured, as shown in FIG. 5C, the flow channels such as the pressure chamber 622 are formed in the flow channel formation plate 620 below the piezoelectric element 100, and the nozzle plate 610 is provided. Furthermore, as shown in FIG. 5C, the housing 630, which includes a sealing plate, is provided so as to seal the piezoelectric element 100. Although not shown, the flow channel formation plate 620 and so on may be processed after the sealing plate has been provided.

The manufacturing method for the piezoelectric element 100 according to this embodiment has, for example, the following characteristics.

With the piezoelectric element manufacturing method according to this embodiment, the first and second conductive portions and the third conductive portion are formed through dry etching using the first portion, the second portion, and the resist layer as a mask, and thus the first and second conductive portions can be disposed with precision at the end portions of the third conductive portion. Accordingly, in the manufacturing process, it is unnecessary to take into consideration alignment error in the dispositions of the first and second conductive portions relative to the end portions of the third conductive portion, which makes it possible to manufacture a highly-reliable piezoelectric element with precision and with ease.

Excessive displacement and stress concentrations in the piezoelectric element are greater toward the end portions in the lengthwise direction thereof, and thus it is desirable for the first conductive portion 33 and the second conductive portion 34 to be disposed in positions that are as close as possible to the respective end portions of the third conductive portion 35. With the piezoelectric element manufacturing method according to this embodiment, the second electrode 30 is formed using the resist layer 130, as described above; accordingly, the first conductive portion 33 and the second conductive portion 34 can be disposed in a location that is close to the respective end portions of the third conductive portion 35 with precision and with ease, in comparison to a case in which the third conductive layer 30b and the second conductive layer 30a are etched in stages.

In addition, as is the case with the piezoelectric element manufacturing method according to this embodiment, forming the first conductive portion 33, the second conductive portion 34, and the third conductive portion 35 through a single dry etching process using the common resist layer 130 makes it difficult for unintended over-etching to occur in the horizontal direction (the direction that is orthogonal to the thickness direction of the first conductive portion 33, the second conductive portion 34, and the third conductive portion 35), as compared to a case in which the third conductive layer 30b and the second conductive layer 30a are etched in stages through wet etching. Through this, the first conductive portion 33, the second conductive portion 34, and the third conductive portion 35 can be formed at highly precise locations, and can be formed having desired shapes. Accordingly, with the piezoelectric element manufacturing method according to this embodiment, it is possible to improve the yield of the production line.

Meanwhile, the first conductive portion 33 and the second conductive portion 34 may be configured of different materials from the third conductive portion 35, which is provided directly above the piezoelectric layer 20. In the case where the first conductive portion 33 and the second conductive portion 34 have been disposed upon the upper surface of the piezoelectric layer 20 due to alignment error or the like occurring during the manufacturing process, portions having different voltage application rates will be formed around the end portions of the piezoelectric layer 20. This can lead to a drop in the reliability of the physical output of the piezoelectric element 100. However, with the piezoelectric element manufacturing method according to this embodiment, the possibility of the first conductive portion 33 and the second conductive portion 34 being disposed on the upper surface of the piezoelectric layer 20 is eliminated, and thus a highly-reliable piezoelectric element can be manufactured with precision and with ease.

4. Liquid Ejecting Apparatus

Figure 6:
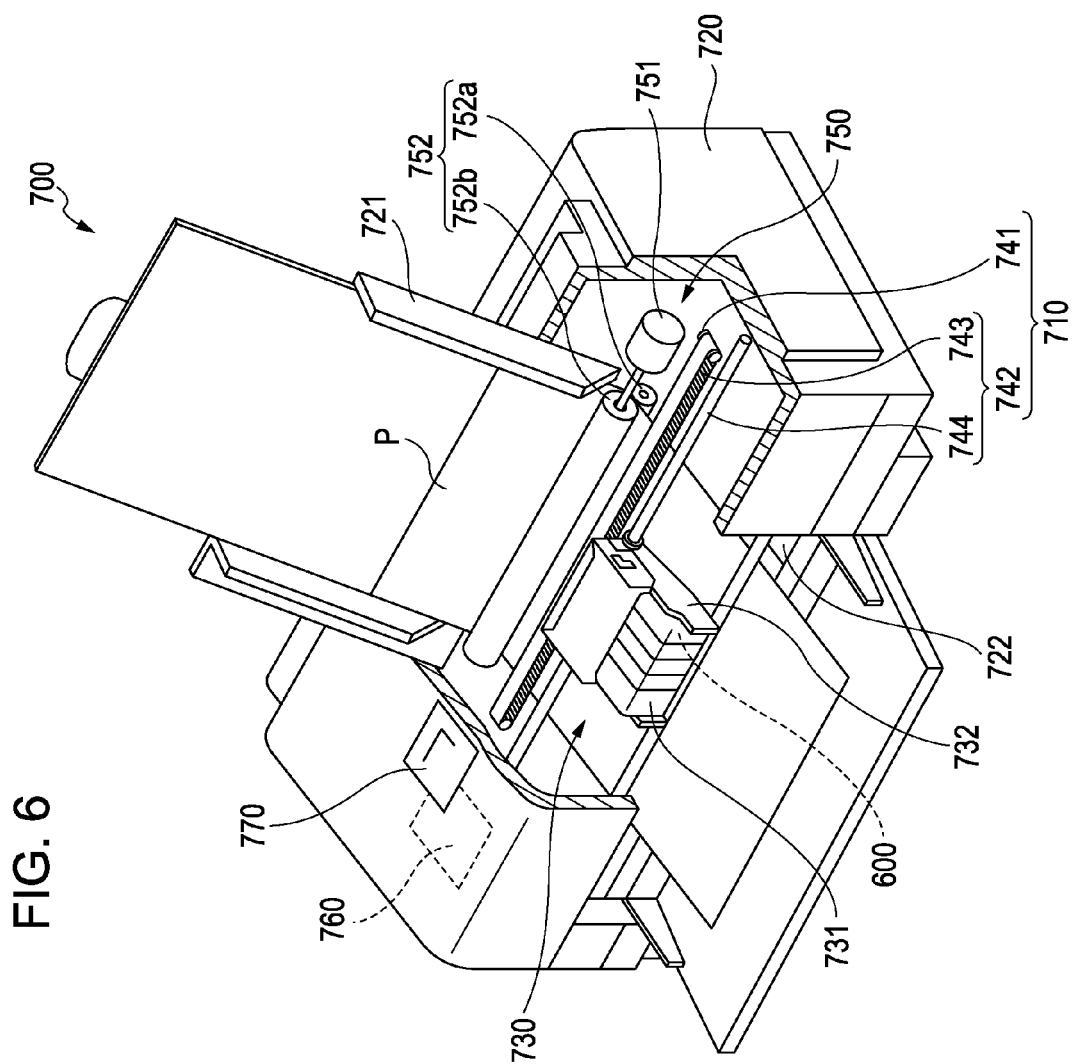
FIG. 6 is a perspective view schematically illustrating a liquid ejecting apparatus.

Next, a liquid ejecting apparatus according to this embodiment will be described with reference to the drawings. The liquid ejecting apparatus includes the aforementioned liquid ejecting head. Hereinafter, a case in which the liquid ejecting apparatus is embodied as an ink jet printer including the aforementioned liquid ejecting head 600 will be described. FIG. 6 is a perspective view schematically illustrating a liquid ejecting apparatus 700 according to this embodiment.

The liquid ejecting apparatus 700 includes, as shown in FIG. 6, a head unit 730, a driving unit 710, and a control unit 760. Furthermore, the liquid ejecting apparatus 700 can include a main body 720, a paper supply unit 750, a tray 721 in which recording paper P is provided, a discharge opening 722 that discharges the recording paper P, and an operation panel 770 that is disposed on the upper surface of the main body 720.

The head unit 730 includes an ink jet recording head configured from the aforementioned liquid ejecting head 600 (this is called simply a "head" hereinafter). The head unit 730 further includes an ink cartridge 731 that supplies ink to the head and a transport unit (carriage) 732 in which the head and the ink cartridge 731 are installed.

The driving unit 710 can cause the head unit 730 to move back and forth. The driving unit 710 includes a carriage motor 741 that serves as a driving source for the head unit 730, and a back-and-forth driving mechanism 742 that causes the head unit 730 to move back and forth as a result of the rotation of the carriage motor 741.

The back-and-forth driving mechanism 742 includes a carriage guide shaft 744 whose ends are supported by a frame (not shown) and a timing belt 743 that extends parallel to the carriage guide shaft 744. The carriage guide shaft 744 supports the carriage 732 so as to be capable of moving freely back and forth. Furthermore, the carriage 732 is anchored to part of the timing belt 743. When the timing belt 743 is caused to travel as a result of the operation of the carriage motor 741, the head unit 730 moves back and forth, being guided by the carriage guide shaft 744. Ink is ejected as appropriate from the head during this back-and-forth movement, and printing is carried out on the recording paper P in this manner.

Although this embodiment illustrates an example in which printing is carried out while both the liquid ejecting head 600 and the recording paper P move, it should be noted that the liquid ejecting apparatus according to the invention may employ a mechanism in which printing is carried out onto the recording paper P by changing the relative positions of the liquid ejecting head 600 and the recording paper P. In addition, although this embodiment illustrates an example in which printing is carried onto the recording paper P, the recording medium on which printing can be carried out by the liquid ejecting apparatus according to the invention is not limited to paper; a wide range of media, such as cloth, film, metal, or the like, can be employed, and the configuration can be changed as suitable for such media.

The control unit 760 can control the head unit 730, the driving unit 710, and the paper supply unit 750.

The paper supply unit 750 can feed the recording paper P from the tray 721 toward the head unit 730. The paper supply unit 750 includes a paper supply motor 751 that serves as a driving source thereof, and paper supply rollers 752 that rotate as a result of the operation of the paper supply motor 751. The paper supply rollers 752 include a slave roller 752a and a driving roller 752b, which serve as a pair of upper and lower rollers that surround the supply path of the recording paper P. The driving roller 752b is linked to the paper supply motor 751. When the paper supply unit 750 is driven by the control unit 760, the recording paper P is supplied so as to pass underneath the head unit 730.

The head unit 730, the driving unit 710, the control unit 760, and the paper supply unit 750 are provided within the main body 720.

The liquid ejecting apparatus 700 includes the piezoelectric element 100 manufactured according to the piezoelectric element manufacturing method of this embodiment. Accordingly, it is possible to realize a liquid ejecting apparatus that has improved reliability.

Although the liquid ejecting apparatus illustrated as an example above includes a single liquid ejecting head, and printing is carried out onto the recording medium by this liquid ejecting head, it should be noted that the liquid ejecting apparatus may include multiple liquid ejecting heads. In the case where the liquid ejecting apparatus includes multiple liquid ejecting heads, the multiple liquid ejecting heads may operate as described above independently from each other, or the multiple liquid ejecting heads may be linked to each other, operate as a single integrated head. A line-type head, in which the respective nozzle holes of the multiple heads are provided at uniform intervals across all of the heads, can be given as an example of such an integrated head.

Although the liquid ejecting apparatus 700, embodied as an ink jet printer, has been described thus far as an example of a liquid ejecting apparatus according to the invention, the liquid ejecting apparatus according to the invention can also be used industrially. In such a case, various types of functional materials whose viscosities have been adjusted to an appropriate level using a solvent, a dispersion medium, or the like can be used as the liquid or the like (liquid-form material) that is ejected. In addition to image recording apparatuses such as the aforementioned printer, the liquid ejecting apparatus according to the invention can also be used as a coloring material ejecting apparatus used in the manufacture of color filters for liquid-crystal displays and the like, a liquid material ejecting apparatus used to form the electrodes, color filters, and so on of organic EL displays, FEDs (front emission displays), electrophoretic displays, and so on, a bioorganic matter ejecting apparatus used in the manufacture of biochips, and so on.

Note that the aforementioned embodiment and variations thereon are each examples, and the invention is not intended to be limited thereto. For example, the embodiment and the various variations can be combined with each other as appropriate.

The invention is not intended to be limited to the aforementioned embodiment, and various further variations can be carried out. For example, configurations that are identical in essence to the configuration described in the aforementioned embodiment (for example, configurations whose functions, methods, and affects are the same, or whose purposes and effects are the same) are also included within the scope of the invention. Furthermore, configurations in which elements that are not essential to the configuration described in the embodiment have been replaced are also included within the scope of the invention. Further still, the scope of the invention also includes configurations that exhibit the same effects or configurations that achieve the same purposes as the configuration described in the aforementioned embodiment. Finally, the scope of the invention includes configurations in which known techniques have been added to the configuration described in the aforementioned embodiment.

What is claimed is:

1. A manufacturing method of a piezoelectric element which has a longitudinal direction and a piezoelectric layer interposed by two electrodes comprising:
   forming a first conductive layer upon a substrate;
   forming the piezoelectric layer upon the substrate and the first conductive layer;
   forming a contact hole through piezoelectric layer on the first conductive layer
   forming a second conductive layer upon the piezoelectric layer and a first wiring layer in the contact hole;
   forming a third conductive layer upon the second conductive layer and a second wiring layer which is connected to the first wiring layer and led out of the contact hole;
   forming a first portion which is located at one end in the longitudinal direction of the second conductive layer, a second portion which is located at the other end in the longitudinal direction of the second conductive layer, and an opening portion provided between the first portion and the second portion by patterning the third conductive layer;
   forming a resist layer that covers the opening portion and covers the edges of the first portion and the second portion that face the opening portion side; and
   forming a first conductive portion and a second conductive portion configured from the first portion and the second portion, and a third conductive portion configured from the second conductive layer, by dry-etching the second conductive layer using the first portion, the second portion, and the resist layer as a mask.

2. The manufacturing method of the piezoelectric element according to claim 1,
   wherein a material of the second conductive layer is different from a material of the third conductive layer.

3. The manufacturing method of the piezoelectric element according to claim 1,
   wherein a material of the second conductive layer includes iridium; and
   a material of the third conductive layer includes gold and a nickel-chromium alloy.

4. The manufacturing method of the piezoelectric element according to claim 1,
   wherein the forming the first conductive portion, the second conductive portion, and the third conductive portion configured from the second conductive layer includes forming a concavity in an exposed portion of the piezoelectric layer that is between the second conductive layer and the second wiring layer, the second conductive layer and the second wiring layer being distanced from each other.

5. The manufacturing method for a liquid ejecting head that includes the manufacturing method of a piezoelectric element according to claim 1.

6. The manufacturing method for a liquid ejecting head that includes the manufacturing method of a piezoelectric element according to claim 2.

7. The manufacturing method for a liquid ejecting head that includes the manufacturing method of a piezoelectric element according to claim 3.

8. The manufacturing method for a liquid ejecting head that includes the manufacturing method of a piezoelectric element according to claim 4.

* * * * *